United States Patent
Ulrick et al.

(10) Patent No.: US 6,498,531 B1
(45) Date of Patent: Dec. 24, 2002

(54) DIGITAL CLASS-D AUDIO AMPLIFIER

(75) Inventors: John W. Ulrick, Woodland Hills; Wayne P. Simoni, West Hills, both of CA (US)

(73) Assignee: Spectron, Chatsworth, CA (US)

( * ) Notice: Subject to any disclaimer, the term of this patent is extended or adjusted under 35 U.S.C. 154(b) by 0 days.

(21) Appl. No.: 09/638,465

(22) Filed: Aug. 14, 2000

(51) Int. Cl.$^7$ ................................................ H03F 3/38
(52) U.S. Cl. ...................... 330/10; 330/207 A; 330/251
(58) Field of Search ................................ 330/10, 207 A, 330/251

(56) References Cited

U.S. PATENT DOCUMENTS

| | | | |
|---|---|---|---|
| 4,683,439 A | * | 7/1987 | Atherton et al. ............... 330/10 |
| 5,406,284 A | | 4/1995 | Lin et al. |
| 5,510,753 A | | 4/1996 | French |
| 5,559,467 A | | 9/1996 | Smedley |
| 5,610,553 A | * | 3/1997 | Kirn ............................. 330/10 |
| 5,617,058 A | | 4/1997 | Adrian et al. |
| 5,973,368 A | | 10/1999 | Pearch et al. |
| 6,127,885 A | * | 10/2000 | Colangelo ..................... 330/10 |
| 2001/0010482 A1 | * | 8/2001 | Oki et al. ...................... 330/10 |

FOREIGN PATENT DOCUMENTS

JP 6303061 * 10/1994 ................... 330/10

OTHER PUBLICATIONS

"Design of an Integrated ATE Amplifier";Bowhers, AGW.J.; Autotestcon '94. IEEE Systems Readiness Technology Conference, Conference Proceedings, Anaheim, CA, 20–22 Sep. 20, 1994; IEEE, pp. 945–748; ISBM 0–7803–1910–9.

* cited by examiner

Primary Examiner—Michael B Shingleton
(74) Attorney, Agent, or Firm—Seldon & Scillieri LLP

(57) ABSTRACT

A Class-D audio amplifier is disclosed which accepts a digitized audio signal input and drives a load such as a loudspeaker without digital-to-analog conversion. The amplifier preferably comprises (1) means for processing a plurality of digital audio input values to create a plurality of deviation values respectively based on the deviation of the input value's relationship from a previous audio input value, (2) means for producing a carrier signal, (3) modulation means for using the deviation values to responsively modulate the carrier signal by varying the frequency of its waveform inversely with the magnitudes of the deviation values, and (4) filter means operative on the modulated carrier to produce an analog voltage capable of driving the load.

12 Claims, 3 Drawing Sheets

DIGITAL CLASS-D AUDIO AMPLIFIER

BACKGROUND OF THE INVENTION

Audio amplifiers have been manufactured using class-A and class A-B configurations since the earliest days of radio. These amplifiers are the simplest to implement and have been manufactured using vacuum tubes and transistors. These class A and class A-B amplifiers, while simple and easy to manufacture, are inefficient. Their output stages operate at about 40% efficiency. resulting in heat generation. This means that for each 100 watts of input power, they only put out about 40W.

The concept of class-D amplifiers (often referred to as switching amplifiers) has been known for many decades. and class-D amplifiers have been used in control systems, where relatively low carrier frequencies are acceptable, since the 1960s. In the mid 1970s one of the co-inventors herein developed the first commercially successful class-D analog input audio amplifier. Class-D has the advantage of high efficiency, cooler operation and, ultimately, improved sound quality. Disadvantages have been the increased complexity and RF emissions. Implementing part of the class-D amplifier in an integrated circuit form and housing the amplifier in a sheet metal box has reduced the complexity and RF emissions, respectively.

Class-D amplifiers with analog inputs have been in manufacture for many years. During the late 1990s there has, in fact, been surge of activity in analog-input audio class-D amplifiers. The use of less energy and the generation of less heat are important considerations in multi-channel home theater amplifiers, for example, where five or more audio channels are typically found.

Audio sources are now migrating towards digital; the phonograph record has been almost completely replaced by the compact disk (hereinafter, "CD") and digital audio tape (hereinafter, "DAT"), and video tape is being replaced by the digital video disk (hereinafter, "DVD"). TV is becoming digital with the advent of direct broadcast TV. Computer audio is digital by nature.

This invention is accordingly directed to an amplifier that can accept the digital output of a digital source (e.g., CD, DVD, DAT) without digital/analog conversion. Audio amplifiers which can directly accept the digital output of CDs, DATs, and DVDs, as well as future formats of future media, are very desirable because they eliminate the need to have a digital-to-analog converter and thereby offer improved sound quality.

It is a further object of this invention to provide such an amplifier having a preferred design that can be implemented in one low-cost digital integrated circuit.

SUMMARY OF THE INVENTION

The invention herein is a digital class-D audio amplifier which accepts digital audio inputs and amplifies them without the use of a D/A converter. Briefly, the digital audio input is processed to create an error value of the audio input's relationship with the previous audio input. The error value is used to pulse-width modulate a carrier signal, and the digitally modulated carrier is low pass filtered so that the amplifier output comprises an analog voltage capable of driving a speaker.

These and other features of the invention will become apparent from the following description of the preferred embodiment, of which the drawing is a part.

DESCRIPTION OF THE DRAWING

FIG. 1 is a block diagram schematic of a digital input amplifier constructed in accordance with the invention; and.

DESCRIPTION OF THE PREFERRED EMBODIMENT

Figure 1:
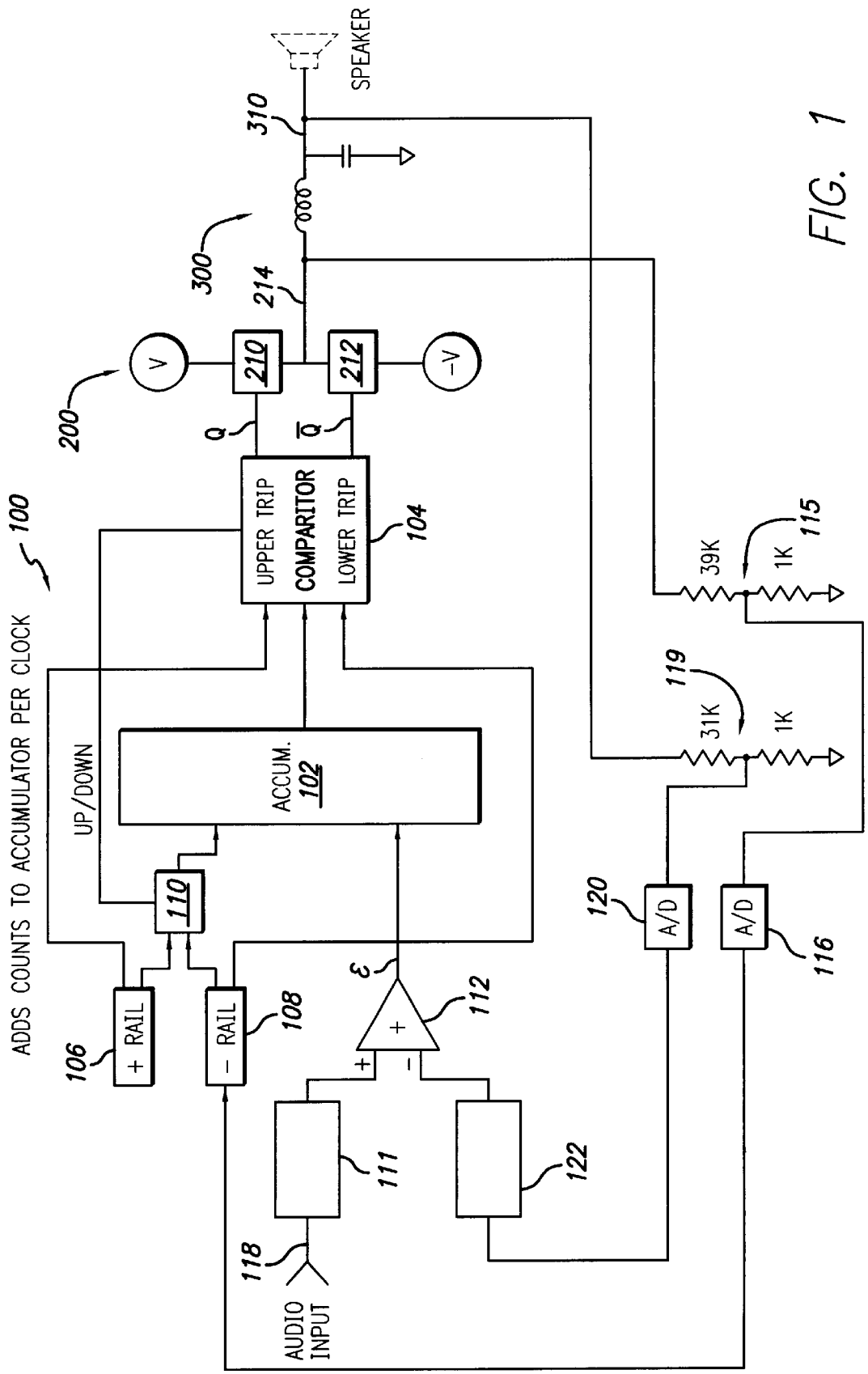

Turning initially to FIG. 1, a block diagram schematic of a digital audio amplifier is shown which is constructed in accordance with the invention. The amplifier comprises a digital modulation system, which in turn comprises three primary blocks; a pulse width modulator 100, a power switching section 200 and an output low pass filter 300. The amplifier is intended to be coupled at its input 118 to a digital source to receive digital audio signal values, and at its output converts digital audio values at its input 118 to a demodulated analog output signal 310 that can drive a speaker or other load.

Figure 2A:
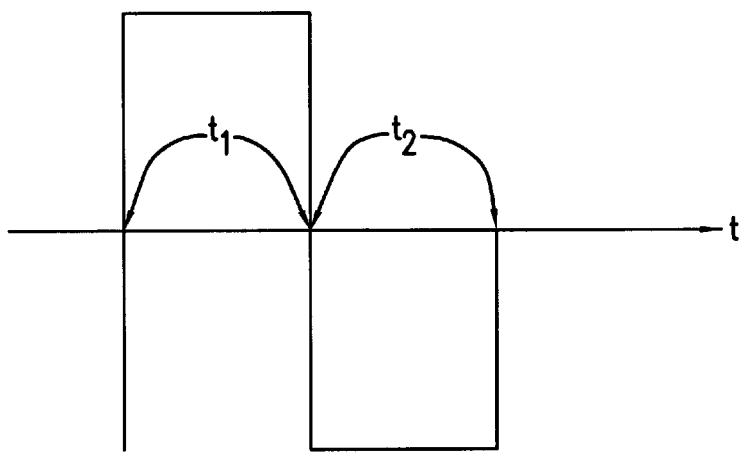
FIGS. 2A–C are graphic representations of a square wave illustrating the effects of pulse width modulation.

This system may be easiest to understand by starting at the output low pass filter 300. The input to the low pass filter is a high frequency square wave (preferably 500 KHz) which is pulse width modulated. For example, as shown in FIG. 2A, a square wave having a duty cycle of 50% is positive one-half of the time and negative one-half of the time. With such an input, the output of the filter 300 would have an average value of zero volts and any residual carrier which had been passed through the low pass filter.

Figure 2B:
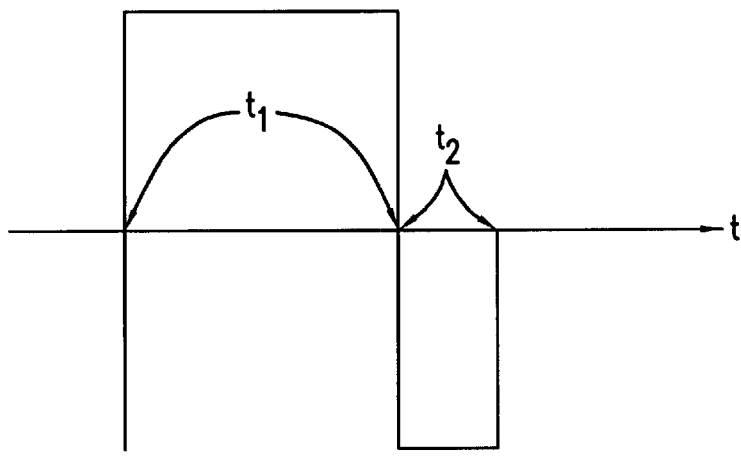
Figure 2C:
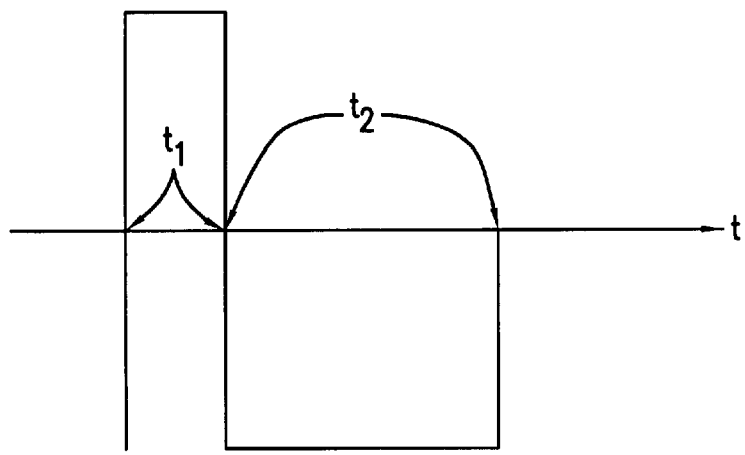

If pulse width modulation varies the square wave input so that it remains positive for more than one-half the time (i.e., the duty cycle is increased), as illustrated in FIG. 2B, the input voltage to the low pass filter has a time average which begins to go positive, and the output of the filter will increase in the positive direction, limited by the power supply (or rail) voltage. Negative output voltages are obtained by a corresponding duty cycle modulation in favor of the negative average output voltage, as illustrated in FIG. 2C.

The filter's output voltage is defined by the square wave's duty cycle according to the equation:

$$e_o = V((t_1 - t_2)/(t_1 + t_2)),$$

where $e_o$ = output voltage,

V = rail voltage, $t_1$ = time period within a cycle for which square wave is positive, and $t_2$ = time period within the cycle for which square wave is negative Since the rail voltage can be considered constant, the output voltage is directly proportional to the duty cycle according to the equation:

$$e_o + kd,$$

where k = value of rail voltage d = duty ratio

Preceding the filter 300 illustrated in FIG. 1 is the power switching section 200 which preferably comprises two power switches; namely, MOSFETs 210, 212. One MOSFET 210 is connected between the positive rail V and the input to the low pass filter 300. The other MOSFET 212 is connected between the negative rail–V and the input to the filter 300. Only one of the MOSFETs conducts at a time; when one is conducting, the other is not. In practice, some "under lap" may be included in the design to insure that there can be no "overlap". In other words, care must be taken to insure that the two MOSFETs are not conducting at the same time, since the result would be a low resistance connection between the positive and negative rails that could damage the switches. Accordingly the circuit is designed so that, in a worst cast scenario, both MOSFETs will be briefly non-conducting rather than conducting.

Those skilled in the art recognize that the outputs from the MOSFETs will be a square wave 214, with the positive portion of the wave being applied to the filter when MOSFET 210 is conducting, and the negative portion of the wave being applied to the filter when the MOSFET 212 is conducting. The amplitude of the square wave is therefore essentially the amplitudes of the positive and negative rail voltages. MOSFET 210 conducts when its input Q is positive. MOSFET 212 conducts when its input Q-bar is negative. The respective conduction times of these two switches are controlled by the preceding modulator section 100, which thereby varies the duty cycle of the square wave applied to the filter.

The MOSFETs alternately turn on and off at a preferred carrier rate of 500 KHz. This is well above the bandwidth of the low pass filter so that the carrier will be substantially attenuated while the audio signal is allowed to pass through to the speakers. The 500 KHz frequency was conveniently chosen to avoid excessive heating which could result from too high a frequency, and to avoid an audibly detectable signal at the speakers which could result from too low a frequency.

The purpose of the modulator section 100 is to convert the digital audio input to the amplifier 118 into pulse width modulation signals that result in an amplifier output voltage 310 that is an analog representation of the modulator's digital input. The modulator section 100 comprises an accumulator 102 coupled at its output to a comparator 104. The accumulator 102 has two input nodes. It is connected at its first node to a selected one of two registers 106, 108 through a multiplexer 110. The accumulator is connected at its second node to an adder 112. As will be explained shortly, the accumulator receives a carrier signal at its first node which is modulated by the audio signal via its second node.

Assuming for the moment that there is no audio signal, a description of the modulator section during amplifier idle is first explained. Briefly, the output of the comparator 104 is toggled between states Q and Q-bar when the output of the accumulator 102 alternately reaches an upper trip level and a lower trip level. The accumulator, in turn, accumulates a count until reaching the count that trips the comparator, whereupon it begins to count in the reverse direction until it reaches the other trip level, and the process repeats. The speed with which the accumulator reaches that count is, in the idle mode, determined by the values of the rail voltages, and results in the generation of the square wave with 50% duty cycle shown in FIG. 2A.

The accumulator is clocked up in 50 steps until it reaches the upper trip level, and is then clocked down in 50 steps until it reaches the lower trip level. The preferred clock rate is 48 MHz. During each of the fifty clocks upward, a digital value is added to the total in the accumulator that is indicative of the rail voltage value. The value of the positive rail voltage is accordingly fed back to the accumulator during the positive portion of the square wave 214 via a voltage-divider network 115 and an A/D converter 116, and stored as a digital value in register 108.

When the comparator is tripped at the upper level, its output Q-bar renders MOSFET 212 conductive, while output Q renders MOSFET 210 non-conductive. The value of the negative rail voltage is fed back during the negative portion of the square wave 214 via the voltage-divider network 115 and A/D converter, and stored as a digital value in register 108. At the time it trips the comparator, the accumulator also trips multiplexor 110 which, in turn, switches the first accumulator input node from the register 106 to register 108. With each clock pulse, the accumulator subtracts the value in the register 108 from the accumulated total until it reaches the lower trip level, whereupon the comparator and multiplexor are tripped again to repeat the process.

In the preferred embodiment, the accumulator rail voltages are nominally +80 volts and –80 volts respectively, and a digital value of 26,000 or so is conveniently assigned to that value of voltage. The digital value is selected to insure that the A/D converter operates within its counting range; in our case, the converter can convert up to values of 28,000, so the 26,000 value has been selected to operate within the converter's counting range.

At the end of the 50 clocks, and with the rail voltage at its nominal value, the count will be 1.4 million. That count is the trip value. Thus, the accumulator counts up to 1.4 million (i.e., 50 clocks times 26,000 counts per clock), at which point the value trips the comparator 104 which, in turn, turns MOSFET 210 off and MOSFET 220 on to produce the negative portion of the square wave. The multiplexor switches the input node of the accumulator to the register 108. and the accumulator begins to decrement with each clock pulse towards the lower trip value. With each clock pulse, 26,000 (or so) is added or subtracted from the accumulator's total depending on which direction the count is being made.

In summary, the accumulator 102 is counting up and then down between trip levels. The value of the trip levels remain constant as the rail voltages vary, with the size of the added and subtracted increments to maintain the 50 clock count between switch points changing proportionally with changes in rail voltage. Alternatively, the trip levels can be varied with varying rail voltages, and the increments held constant. The A/D converter 116 oversamples the output during the period in which the MOSFETs are being switched at 500 KHz, so 32,000 samples are placed in register 120.

The application of digital audio signals at the input 118 to the modulator section results in a pulse-width modulated output at the output 214 of the power switching section 200. Digital audio values 118 are inputted to modulator section input 118, where they are oversampled; in the illustrated embodiment, oversampling is performed at the rate of 44 KHz. This is well above the Nyquist rate which insures that no audio data will be lost, and is conveniently the same rate as the clock rate of the accumulator 102. The input digital audio signal, such as an SPDIF signal, is received by phase locking to its clock frequency and decoding the header-based audio information into a parallel data stream. The PWM system clock is synchronized to the clock rate at 118. This data stream is then fed to a digital multiplier which performs the function of volume control. Although necessary for commercial implementations, the specific manner by which the receiving means and volume control are implemented are not are not considered primary to this invention, and those skilled in the art will recognize that other designs and implementations can be used without departing from the scope of the invention.

Each audio signal value is clocked into a register 111 and then into an adder 112, where it is compared to the digitized value of the amplifier output signal 310. The output signal 310 is accordingly fed back through a voltage divider network 119 and A/D converter 120, and held in a register 122 where it is clocked into the inverting input of the adder. The output of the adder 112 is a digital error signal, $\epsilon$, which the feedback loop drives towards zero.

The value of the error signal $\epsilon$ is applied to the accumulator to either add or subtract a value to the total held by the accumulator. The result is that the accumulator reaches its trip value either sooner or later than it would have in the idle mode. In either case, the change results in the MOSFETs being switched earlier or later, and the pulse width of the square wave accordingly being changed. As the digital input value changes, $\epsilon$ changes accordingly, and the pulse width of the square wave changes accordingly. Thus, the digital input signal 118 pulse-width modulates the 500 KHz. carrier 214.

The resulting pulse width modulation of the power switching section output changes the average voltage of that signal as the duty cycle of the square wave changes. The pulse-width modulated 500 KHz square wave carrier is filtered by the low pass filter 300, which attenuates the carrier and permits only the varying audio signal to pass, thereby driving the speaker(s) to which the amplifier is connected.

Those skilled in the art will recognize that the input 118 to the amplifier is parallel audio data, which has previously been stripped of its associated frame sync and clock which can be processed in any conventional manner such as those techniques which have been used in prior digital audio amplifiers requiring front end D/A conversion. The amplifier herein will accept any of the common audio data rates from 32 Khz up through 96 Khz; i.e., any rate up to half the system clock frequency. The frame sync clocks the audio data into register 111, applying this data to the amplifier. The amplifier operates synchronously with respect to the frame sync at a clock rate of N times the frame sync for stability and timing considerations. This clock is phase locked to the frame sync and is multiplied up by a factor sufficiently high enough to allow the modulator to make pulse width corrections as a fractional percentage of the carrier frequency.

It will be further recognized that the sample rate of the A/D converters 116, 120 are synchronous to the amplifier clock. The A/D major cycle is dependent on the conversion time of the A/D converter. One major A/D cycle samples Eo 3 times, while the square waves V+, V− and output current are sampled once. With the assumption that Eo as well as the power supply rails are modulated at the maximum rate of the audio bandwidth, the A/D conversion rate must satisfy Nyquist with a minimum sample rate of 40 Khz. An alternate mechanization may employ 3 individual A/D converters, one for each of the voltage forms sampled, removing the overhead of controlling the multiplexor and the associated settling time of the waveforms.

In summary, the modulation error signal, $\epsilon$, is generated as described above by the equation:

$\epsilon = E_{in} + \text{square wave} + E_o$, where $E_{in}$ is the digital audio value clocked into register 111. The sum $E_{in} + E_o$ is contained in the register 122, which provides a first order hold to coordinate data input to the accumulator as the data is subsampled. The square wave 214 is represented by the digital values of the positive and negative rail voltages sequentially sampled by the A/D converter 116. These values are stored in registers 106, 108 respectively. Multiplexor 110 is controlled by Q and Q-bar outputs, which are the digital controls to the power switches. The output of comparator 104 is a digital representation of the square wave applied to the output power switches. When Q is active, the positive rail is applied to the output filter, and multiplexor 110 selects the register 106. When Q-bar is active, the negative rail is applied to the output filter, and multiplexor 110 selects register 108.

The pulse width modulation signal Q and Q-bar are generated by accumulating the modulation error $\epsilon$. The accumulator's output is fed into a digital comparator circuit 104 whose input contains hysteresis (i.e., the difference between the upper trip level and lower trip level) which is symmetric about zero counts. With no input signal and no output voltage the accumulator integrates the square wave signal to the input of the output low pass filter, generating a triangle wave whose limits are set by the hysteresis at the input to the comparator. The hysteresis in effect sets the upper bound on the modulation frequency or carrier which is preferably 500 Khz. The input voltage 118 thereby controls the count rate of the accumulator such that the comparator trips at the correct time to form the duty cycle required to obtain the proper output voltage 310. The third input to the accumulator is the amplifier's output voltage 310 in the form of a feed back to correct for errors in the output voltage.

The output of the comparator generates the Q and Q-bar signals to the power switches 210, 212. When the comparator signals the value in the accumulator has exceeded the current hysteresis, the driving MOSFET is shut down, and a mandatory off time (underlap) is preferably enforced to ensure that only one MOSFET is on at any time. The alternate value of the hysteresis is selected, and the alternate MOSFET is enabled, applying the opposite value of the square wave to the filter. When the comparator signals the value of the accumulator has exceeded the alternate hysteresis, the process is repeated.

The input stage of the amplifier (not shown) may employs an off-the-shelf SDPIF input processor integrated circuit. This input stage is responsible for phase locking to the digital input data stream and producing a frame sync, a 1× clock at the data sample rate (~3 MHz). The sample clock is then multiplied up via a phase locked loop to produce the digital amplifier's operating clock frequency.

A digital volume control is employed in the amplifier as well. The input stage of the amplifier feeds circuitry contained in the volume control that converts the serial data from the input stage to a parallel digital word. This parallel word is the digital input to the volume control circuitry referred to as Vin. The volume control is a digital multiplier which may be conveniently defined by the equation:

$V_o = (V_{in} * \text{gain})/(\text{scale factor})$.

The gain is mechanized as a ROM lookup table to provide the typical non-linear control found in stereo systems. The scale factor sets the decimal point for the output of the multiplier. For a 16 bit audio systems the scale factor is $2^{16}$ and for a 24 bit system the scale factor is $2^{24}$. As a typical mechanization, this systems provides 32 volume steps for the amplifier.

The address of the ROM lookup table may come from either a knob with parallel digital outputs or may be a counter which is incremented by volume up/down buttons or a volume knob which outputs digital pulses. The lookup table is generated with an exponential such that at 0, $V_o$ is zero and at 31, $V_o$ shall be at its maximum (e.g., 16 bits for a 16 bit system, 24 bits for a 24 bit system, etc.). The output of the ROM lookup is monotonic where increasing the volume control increases the ROM address, which in turn selects larger gain values to the multiplier.

Figure 3:
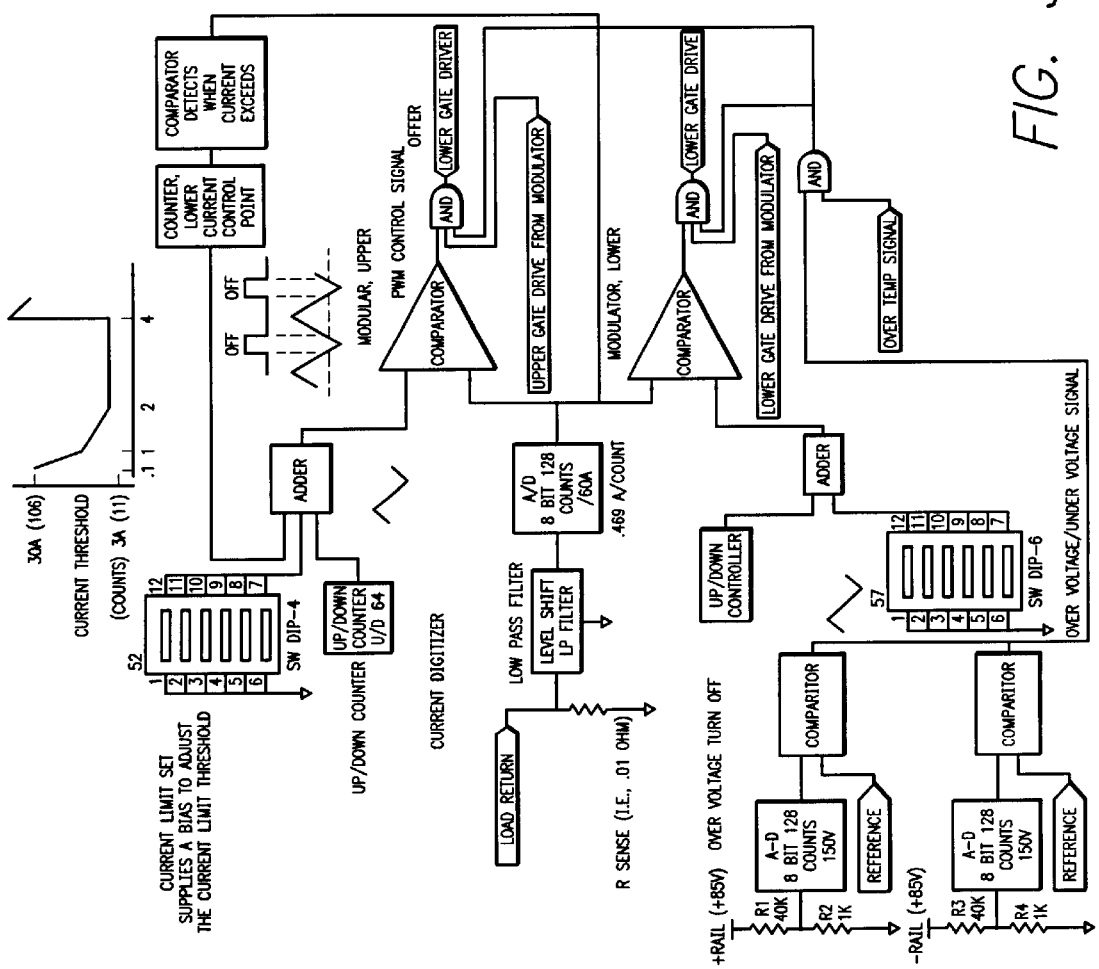
FIG. 3 is a block diagram schematic of a current limiting configuration for the digital input amplifier, constructed in accordance with the invention.

A novel current limiting feature, illustrated in FIG. 3, is included in the digital amplifier in the form of a feedback control system. Audio power amplifiers need protection from shorted outputs and excessive currents due to low load impedance. During normal operation, the digital input signal commands the output to be a voltage that is A times the input signal where A is the amplifier's gain.

If the amplifier's output is inadvertently shorted or the load impedance becomes very low and the input commands a high output voltage, the amplifier's power output section may be damaged by excessive currents. To protect components in the amplifier and speakers, the load current is limited to a preset value. For example, in a 500 watt amplifier the current limit may be set to 50 amps. Accordingly, a novel mode switching scheme now described, provides current or power limiting which is compatible with the foregoing digital input class-D amplifier or any other class-D amplifier. Moreover, this current protection system can reside in the same IC as the primary modulator.

To accomplish this, the load current is sensed and digitized. When the input tries to command an excessive output current, this current limit modulator takes over control of the power output section. This current-limiting PWM modulator generates gate control signal to drive the output to a constant current as long as the fault exists at the output and the input is commanding excessive current. Further, the initial output current limit is set relatively high and decreased as a function of time. For example, it may start at 50 amps, stay at 50 amps for 100 ms and then decline linearly for the next second and then reduce the slope further until two seconds and maintain a constant current limit value, a current that the amplifier can safely output indefinitely. During this time, the load impedance is monitored and when the short is removed, the current limit is reset to the normal 50 amps.

Alternately, the PWM signals to limit the output current can be derived by using the digitized output current to overdrive the primary PWM modulator. There is a substantial disadvantage to this approach, however. The primary modulator, i.e., the one converting the digital input signal into a PWM signal, has a variable output frequency. At very high currents, this results in high switching losses. At high output currents, a constant frequency modulator is much more efficient and hence, more reliable. This constant running frequency is chosen to be low enough to minimize switching losses and high enough to allow the output filter to limit the carrier current in the load. In other words, when the input commands excessive output current, the current limit modulator takes over control until the output current falls below the preset current limit level.

If the main modulator is a variable running frequency modulator, where the switching frequency varies as a function of power demand, the running frequency will fall, approaching the output low pass filter cut-off frequency. When this happens, the output filter can no longer protect the output switch transistor from excessive currents, resulting in failure of the output transistors. In practice, variable frequency modulators have no load running frequencies of 300 to 700 KHz, and fall to zero under very high output power. When the frequency falls to zero, the current in the inductor of the output filter approaches infinity and the output switch transistor will fail. This invention provides a solution such that when the amplifier switches to current limit mode, the current limit modulator operates at a fixed frequency, thus minimizing the switching losses, the losses while one transistor is turning OFF and the opposite one is turning ON. Halving the switching frequency or transitions halves the switching losses. This has no effect on conductive loss, the losses-while the transistor is ON.

If the modulator is a constant frequency modulator, the switching frequency which is optimum for the normal voltage amplification mode is not optimum for the current limit mode. The optimum frequency for the voltage mode may be in the 250 KHz to 700 KHz range while the optimum frequency for the current limit mode is as low as possible but about two octaves above the output filters cut-off frequency such as 125 KHz. One hundred twenty five KHz is about 1.5 octaves above the low pass filter's cut off frequency, enabling the inductor to offer an effective impedance when the load is shorted.

Implementation of this current-limiting modulator is virtually all in digital logic. It is made practical by the existence of low cost digital logic. The audio input signal is in digital form. All of the other signals, output voltage and current, rail voltages and temperature are in analog form. They are accordingly digitized and inputted to the digital processor. This can be accomplished in a number of mechanizations including using one A-D converter for each input or use of an analog multiplexor and one A-D converter, 8 bit precision is more than sufficient. Design is preferably via a high level code such as VHDL which converts functions such as arithmetic and logic functions into gate connections.

There are a plurality of configurations to implement this methodology, which involves forming a modulator to duty-cycle modulate the power switching section to provide a constant current or power. A constant current method is described herein. Constant power modulators are implemented by squaring the digitized current signal according to the equation:

$$P = FR.$$

The preferred embodiment of a current limiting modulator constructed in accordance with the invention is illustrated in FIG. 4, and involves the use of a digital comparator to generate a PWM signal. One of the inputs to this comparator is the low passed and digitized representation of the amplifier's output current. The second input is the digital triangle formed by an up/down counter, whose triangle frequency is the desired carrier frequency (i.e. 500 KHz.).

To set the current limit, a constant number is added to the triangle to vary the PWM signal appearing at the output of the comparator. The comparator output is ANDed with the PWM control signal from the primary modulator in such a way as to insure that, in the current limit mode, the current limit modulator takes over control of the output when over current exists. To accommodate variation in the analog-sensing components, separate current limit modulators are employed, one for positive current and a second for negative currents. These two PWM signals are then ANDed with the over-voltage signal and the over-temp signals in such a way that if the rail voltage exceeds or is less than two pre-set levels, or the heat sink temperature gets too hot, the PWM signals will be inhibited to turn the amplifier off.

If the cost of A-D converters is substantial, this system may be implemented with only one A-D converter with an analog multiplexor. The various signals (output, current, square wave, rails and temperature) may be sampled in various sequences to optimize amplifier and current limit performance.

The output current is low pass filtered to insure the modulation signals are not corrupted by switching noise while variables such as rail voltages and temperatures are low pass filtered to insure that they do not false trigger the current and over voltage protection circuits.

The three inputs to the two AND gates are configured such that for their respective switches to turn ON, all three inputs must be HI.

While the foregoing description includes detail which will enable those skilled in the art to practice the invention, it should be recognized that the description is illustrative in nature and that many modifications and variations will be apparent to those skilled in the art having the benefit of these teachings. For example, such equivalent modulation techniques as pulse-density modulation and phase-shift modulation are known to those skilled in the art, and can be utilized instead of the pulse-width modulation technique illustrated herein in utilizing a digitized audio input signal to drive a load such as a loudspeaker without D/A converters being used to process the signal.

It is accordingly intended that the invention herein be defined solely by the claims appended hereto and that the claims be interpreted as broadly as permitted in light of the prior art.

We claim:

1. An audio amplifier which accepts a plurality of digital audio input values and drives a load such as a loudspeaker without a digital-to-analog converter comprising:
   means for processing the plurality of digital audio input value to create a plurality of deviation values respectively based on the deviation of the input value's relationship from a previous audio input value;
   means for producing a carrier signal;
   modulation means for using the deviation values to responsively modulate the carrier signal by varying the frequency of its waveform inversely with the magnitudes of the deviation values; and
   filter means operative on the modulated carrier to produce an analog voltage capable of driving the load.

2. An audio amplifier which accepts a digitized audio signal and drives a load such as a loudspeaker without a digital-to-analog converter comprising:
   means for receiving a digitized audio signal in the form of a plurality of digital audio input values;
   first electrical circuit means for generating an electrical pulse waveform;
   digital circuit means for pulse-width modulating the pulses of said waveform in accordance with the digitized audio signal to generally preserve the audio information in the modulated waveform, said digital circuit means varying the frequency of said waveform inversely with the magnitudes of said input values; and
   demodulation means operative on the modulated waveform to produce an analog representation of the digitized audio signal.

3. An audio amplifier which accepts a digitized audio signal and drives a load such as a loudspeaker without a digital-to-analog converter comprising:
   (a) means for receiving a digitized audio signal in the form of a plurality of digital audio input values;
   (b) first electrical circuit means for generating an electrical pulse waveform and including
      an accumulator for storing an accumulated digital sum,
      a clock for producing a succession of timing pulses,
      first means, responsive to the timing pulses when operable, for repeatedly adding a digital value to the accumulated digital sum until the accumulated digital sum reaches an upper trip value,
      second means, responsive to the timing pulses when operable, for repeatedly subtracting a digital value from the accumulated digital sum until the accumulated sun reaches the lower trip value, and
      means responsive to the accumulated sum reaching the upper trip value to render said second means operable and to render said first means inoperable, and responsive to the accumulated sum reaching the lower trip value to render said first means operable and said second means inoperable;
   (c) digital circuit means for pulse-width modulating the pulses of said waveform in accordance with the digitized audio signal to generally preserve the audio information in the modulated waveform, and
   (d) demodulation means operative on the modulated waveform to produce an analog representation of the digitized audio signal.

4. The amplifier of claim 3 including bistable circuit means for generating a cyclical electrical waveform having a upper value when said first means is operable and a lower value when said second means is operable.

5. The amplifier of claim 4 including third means responsive to the clock pulse for adding positive or negative values to the accumulator respectively representative of the digital audio input values to vary the time duration in which the waveform is at the first and second values in each cycle.

6. The amplifier of claim 5 including
   power supply means to establish upper and lower rail voltages, said upper and lower values of said waveform being respectively generally proportional thereto, and
   means responsive to the magnitude of the rail voltages to adjust the digital values applied to the accumulated digital sum by the operable one of the first and second means so that the number of clock pulses per cycle of waveform remain substantially constant with varying rail voltages.

7. The amplifier of claim 5 including
   power supply means to establish upper and lower rail voltages, said upper and lower values of said waveform being respectively generally proportionally thereto, and
   means responsive to the magnitude of the rail voltages to vary the upper and lower trip values so that the number of clock pulses per cycle of waveform remain substantially constant with varying rail voltages.

8. The amplifier of claim 5 wherein the demodulation means includes means responsive to the duty cycle variations in the waveform to produce a correspondingly varying analog signal level to drive a load such as a loudspeaker.

9. The amplifier of claim 3 including third means responsive to the clock pulse for adding positive or negative values to the accumulator respectively representative of the digital audio input values to vary the time taken by the accumulator to reach the approaching trip level.

10. An audio amplifier which accepts a plurality of digital audio input values and drives a load such as a loudspeaker without a digital-to-analog converter comprising:
    accumulator means for storing a count that cyclically increases to an upper trip level and then decreases to a lower trip level;
    comparator means responsive to the accumulator for producing a first output while the accumulator is increasing towards the upper trip level and a second output while the accumulator is decreasing towards the lower trip level; and
    adder means responsive to the input audio values to add representative values thereof to the accumulated count in order to correspondingly modulate the time duration of the comparator output states counting up and down between upper and lower trip levels.

11. A digital modulator which accepts a plurality of digital audio input values and produces a modulated signal representative thereof without digital-analog conversion comprising:
   (a) means for generating a substantially square wave waveform including
       (1) an accumulator for storing a digital value;
       (2) means for cyclically incrementing the stored value upward and then downward between upper and lower trip values;
       (3) means for producing an electrical wave form having a first pulse level while the stored value is incremented upward, and having a second pulse value while the stored value is being incremented downward; and
   (b) pulse-width modulating means including
       (1) an adder,
       (2) register means,
       (3) means for sampling the digital audio input values, and
       (4) means for adding to the accumulator positive and negative digital values representative of the sampled audio input values to vary the time taken by the accumulator to reaching the approaching trip value, thereby pulse-width modulating the waveform in accordance with the incoming audio values.

12. The modulator of claim 11 including register means;

means for clocking the sampled input values into the register, said adding means being electrically coupled to the register means to receive the digital input values;

means coupling the output of the adding means to the accumulator; and feedback means coupled to the adding means to enable the addressing means to produce an output digital value representative of the difference between the sampled input value and the output of the amplifier.

* * * * *